United States Patent
Kaneko et al.

(10) Patent No.: US 9,247,644 B2
(45) Date of Patent: Jan. 26, 2016

(54) WIRING BOARD AND METHOD FOR MANUFACTURING THE SAME

(71) Applicant: SHINKO ELECTRIC INDUSTRIES CO., LTD., Nagano-shi, Nagano (JP)

(72) Inventors: Kentaro Kaneko, Nagano (JP);
Kazuhiro Kobayashi, Nagano (JP);
Toshimitsu Omiya, Nagano (JP);
Kotaro Kodani, Nagano (JP);
Shunichiro Matsumoto, Nagano (JP);
Ruofan Tang, Nagano (JP)

(73) Assignee: SHINKO ELECTRIC INDUSTRIES CO., LTD., Nagano-Shi (JP)

( * ) Notice: Subject to any disclaimer, the term of this patent is extended or adjusted under 35 U.S.C. 154(b) by 0 days.

(21) Appl. No.: 14/329,062

(22) Filed: Jul. 11, 2014

(65) Prior Publication Data
US 2015/0014027 A1    Jan. 15, 2015

(30) Foreign Application Priority Data

Jul. 11, 2013    (JP) .................................. 2013-145914

(51) Int. Cl.
*H05K 1/03*  (2006.01)
*H05K 1/09*  (2006.01)
*H05K 1/00*  (2006.01)
(Continued)

(52) U.S. Cl.
CPC .............. *H05K 1/113* (2013.01); *H05K 3/3452* (2013.01); *H05K 3/244* (2013.01); *H05K 3/383* (2013.01); *H05K 3/4682* (2013.01); *H05K 2201/09472* (2013.01); *H05K 2201/09745* (2013.01); *H05K 2201/2072* (2013.01); *H05K 2203/0152* (2013.01); *H05K 2203/0307* (2013.01); *H05K 2203/0376* (2013.01);
(Continued)

(58) Field of Classification Search
CPC ............. H05K 2201/09472; H05K 2203/0307
USPC ........................... 174/251, 255, 258; 361/767
See application file for complete search history.

(56) References Cited

U.S. PATENT DOCUMENTS 5,741,575 A * 4/1998 Asai ........................ C08G 59/18
                                                                  361/748
7,612,445 B2 * 11/2009 Murai ................. H01L 23/3128
                                                                  257/692
(Continued)

FOREIGN PATENT DOCUMENTS

JP          2012-209580        10/2012

OTHER PUBLICATIONS

This application is co-pending with U.S. Appl. No. 14/329,073, filed Jul. 11, 2014.

*Primary Examiner* — Sherman Ng
(74) *Attorney, Agent, or Firm* — Rankin, Hill & Clark LLP

(57) ABSTRACT

A wiring substrate includes an insulating layer, a pad, and a solder resist layer. The insulating layer has a first surface formed with a first recess portion. The pad is embedded in the first recess portion. The pad includes a second surface and a third surface. The third surface that is located at a lower position than the first surface so as to expose an inner wall surface of the first recess portion. The pad is formed with a second recess portion in a center portion of the third surface. The solder resist layer is provided on the first surface. An adjacent portion of the first surface to a peripheral portion of the first recess portion is smaller in roughness than a region of the first surface peripheral to the adjacent portion of the first surface.

10 Claims, 6 Drawing Sheets

(51) Int. Cl.
*H05K 7/10* (2006.01)
*H05K 1/11* (2006.01)
*H05K 3/34* (2006.01)
*H05K 3/24* (2006.01)
*H05K 3/38* (2006.01)
*H05K 3/46* (2006.01)

(52) U.S. Cl.
CPC .............. *H05K 2203/0384* (2013.01); *H05K 2203/1184* (2013.01); *H05K 2203/308* (2013.01)

(56) References Cited

U.S. PATENT DOCUMENTS

| | | | |
|---|---|---|---|
| 8,258,409 B2* | 9/2012 | Kohara | H01L 23/3128 174/261 |
| 2008/0245549 A1* | 10/2008 | Kodani | H05K 3/205 174/126.1 |
| 2009/0095514 A1 | 4/2009 | Kaneko | |
| 2010/0083495 A1* | 4/2010 | Hirayama | H05K 1/187 29/839 |
| 2012/0222894 A1* | 9/2012 | Kaneko | H05K 3/244 174/257 |

* cited by examiner

WIRING BOARD AND METHOD FOR MANUFACTURING THE SAME

CROSS-REFERENCE TO RELATED APPLICATION(S)

This application claims priority from Japanese Patent Application No. 2013-145914, filed on Jun. 11, 2013, the entire contents of which are herein incorporated by reference.

BACKGROUND

1. Field

Exemplary embodiments of the invention relate to a wiring board and a method for manufacturing the wiring board.

2. Related Art

What is called build-up wiring boards are known in which wiring layers and insulating layers are stacked alternately and the wiring layers are connected to each other through via holes which penetrate through the insulating layers. For example, such build-up wiring boards are manufactured by stacking wiring layers and insulating layers on a support body and then removing the support body.

In a manufacturing process of a build-up wiring board, a surface of a support body may be roughened. In this case, when the support body is removed, the roughened surface of the support body is transferred to an insulating layer or the like that has been formed on the support body. Therefore, when a solder resist layer, an underfill resin, or the like is formed on the roughened surface of the insulating layer after the removal of the support body, adhesion property between the insulating layer and the solder resist layer, underfill resin, or the like can be improved (for example, see JP 2012-209580 A (corresponding to US 2009/0095514 A).

SUMMARY

However, in the above-described manufacturing process of the build-up wiring board, the roughened surface of the support body are also transferred to surfaces of pads to be connected to, for example, electrodes of a semiconductor chip, and even the surfaces of the pads are roughened. As a result, the surfaces of the pads are lowered in solder wettability, which may lead to that it is difficult to sufficiently ensure the reliability of connections between the pads of the build-up wiring board and, for example, the electrodes of the semiconductor chip.

Exemplary embodiments of the invention have been made in view of the above circumstances, and provide a wiring board, etc. having pads which can enhance the reliability of connections with connection targets.

According to one exemplary embodiment, a wiring substrate includes an insulating layer, a pad, and a solder resist layer. The insulating layer has a first surface formed with a first recess portion. The pad is embedded in the first recess portion. The pad includes a second surface and a third surface. The second surface is in contact with a bottom surface of the first recess portion. The third surface that is located at a lower position than the one surface of the insulating layer so as to expose an inner wall surface of the first recess portion. The pad is formed with a second recess portion, having a smooth bottom surface, in a center portion of the third surface. The solder resist layer is provided on the one surface of the insulating layer and is formed with an opening portion through which the second recess portion is exposed. An adjacent portion of the solder resist layer to a peripheral portion of the opening portion extends to an inside of the first recess portion so as to cover the inner wall surface of the first recess portion and a peripheral portion of the third surface of the pad. The adjacent portion of the solder resist layer protrudes from the peripheral portion of the third surface of the pad toward the center portion of the third surface of the pad so as to cover above the second recess portion. (i) Surfaces of the pad including the second surface of the pad and being in contact with the insulating layer and (ii) the peripheral portion of the third surface of the pad are roughened surfaces. The one surface of the insulating layer is a roughened surface. An adjacent portion of the first surface to a peripheral portion of the first recess portion is smaller in roughness than a region of the first surface peripheral to the adjacent portion of the first surface.

The disclosed technique makes it possible to provide a wiring board, etc. having pads, which can enhance the reliability of connections with an object

DETAILED DESCRIPTION

Figure 1A:
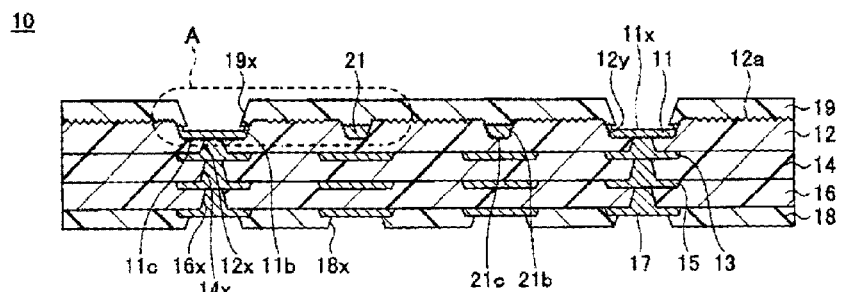
FIG. 1A is a section view of a wiring board according to an exemplary embodiment of the invention.

Exemplary embodiments of the invention will be hereinafter described with reference to the accompanying drawings. In the drawings, the same constituent elements will be given the same reference symbol and may not be described redundantly.

[Structure of Wiring Board According to One Exemplary Embodiment]

Figure 1B:
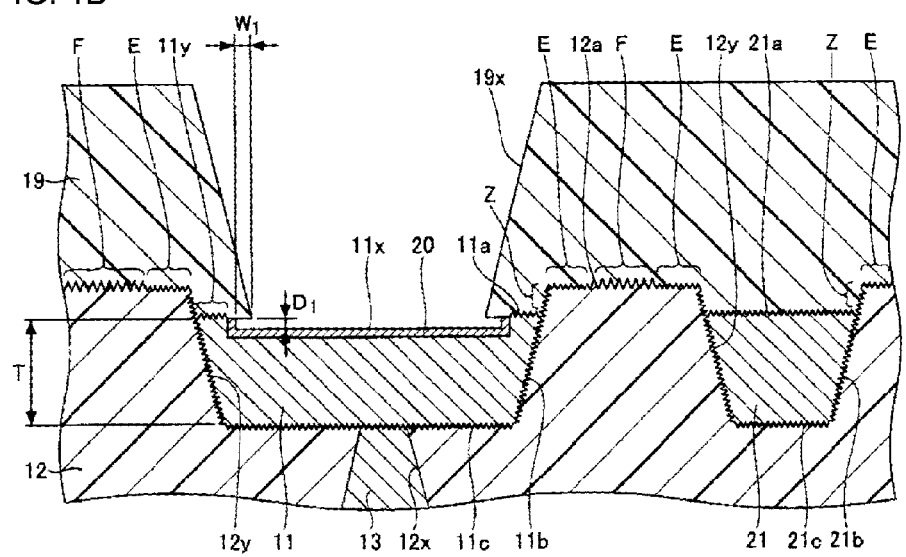
FIG. 1B is an enlarged section view, taken along a line B-B in FIG. 1C, of a part A of FIG. 1A.
Figure 1C:
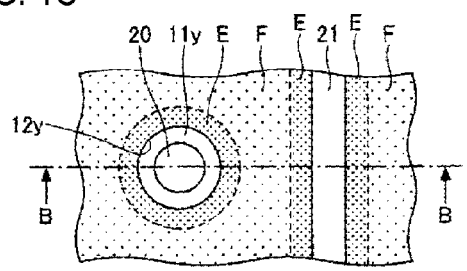
FIG. 1C is an enlarged plan view of the part A of FIG. 1A.

First, a structure of a wiring board according to a first exemplary embodiment will be described. FIG. 1A is a section view of the wiring board according to the exemplary embodiment. FIG. 1B is an enlarged section view, taken along a line B-B in FIG. 1C, of a part A of FIG. 1A. FIG. 1C is an enlarged plan view of the part A of FIG. 1A. Surface-treated layers 20 are omitted in FIG. 1A, and a solder resist layer 19 is omitted in FIG. 1C.

As shown in FIGS. 1A to 1C, the wiring board 10 according to the exemplary embodiment has pads 11, an insulating layer 12, a wiring layer 13, an insulating layer 14, a wiring layer 15, an insulating layer 16, a wiring layer 17, solder resist layers 18 and 19, surface-treated layers 20, and wiring patterns 21. The wiring board 10 is a so-called coreless build-up wiring board.

In the exemplary embodiment, for the sake of convenience, a solder resist layer 18 side of a member will be referred to as a lower side or one side of the member, and a solder resist layer 19 side of the member will be referred to as an upper side or another side of the member. Also, a surface, located on the solder resist layer 18 side, of a member will be referred to as a lower surface or one surface of the member, and a surface, located on the solder resist layer 19 side, of the member will be referred to as an upper surface or another surface (the other surface) of the member. The term "plan view" means viewing an object in a direction normal to an upper surface 12a of the insulating layer 12. Also, the term "plan-view shape" means a shape of an object when viewed in the direction normal to the upper surface 12a of the insulating layer 12.

In the wiring board 10, the insulating layer 12 is a layer on which the pads 11 and the wiring patterns 21 are formed. However, only the pads 11 may be formed on the insulating layer 12 (no wiring patterns 21 are formed). For example, the insulating layer 12 may be made of a material having, as a main component, an insulating resin such as a thermosetting epoxy-based resin. The insulating layer 12 may contain a filler such as silica ($SiO_2$). The insulating layer 12 may have, for example, about 15 to 35 µm in thickness.

The insulating layer 12 is formed with first recess portions 12y which are concave from the upper surface 12a (an example of a first surface) of the insulating layer 12 toward an insulating layer 14 side. Each first recess portion 12y may have a tapered shape in section. A width of the tapered shape in a vicinity of the bottom surface of the first recess portion 12y (on the insulating layer 14 side) is narrower than a width of the tapered shape in a vicinity of the upper surface 12a of the insulating layer 12. Each first recess portion 12 of the insulating layer 12 may be formed in, for example, an inverted cone frustum shape.

The upper surface 12a of the insulating layer 12 is a roughened surface. An adjacent portion (a region E shown in FIG. 1B) of the upper layer 12a of the insulating layer 12 to a peripheral portion of each first recess portion 12y is smaller in roughness than the other portions (regions F peripheral to the regions E) of the upper surface 12a of the insulating layer 12. For example, the roughness Ra of the regions E may be equal to or higher than about 0.2 µm and lower than about 0.3 µm. For example, the roughness Ra of the regions F may be equal to or higher than about 0.3 µm and lower than about 0.5 µm. The roughness can be measured using a light interference type instrument, for example.

In other words, in the exemplary embodiment, the upper surface 12a of the insulating layer 12 has the two types of roughened surfaces, that is, (i) the roughened surfaces of the adjacent portions (regions E) to the peripheral portions of the first recess portions 12y and (ii) the roughened surfaces of the regions (regions F) peripheral to the adjacent portions (regions E). The regions F constitute the entire area of the upper surface 12a of the insulating layer 12 excluding the regions E.

An adjacent portion (region E) of the upper layer 12a of the insulating layer 12 to the wiring pattern 21 is smaller in roughness than the other portions (the regions F peripheral to the adjacent portion (region E) to the peripheral portion of each first recess portion 12y) of the upper surface 12a of the insulating layer 12.

As shown in FIG. 1C, in the upper surface 12a of the insulating layer 12, the portion (region E) adjacent to each first recess portion 12y in which the pad 11 or the wiring pattern 21 is embedded surrounds the pad 11 or extends along the wiring pattern 21.

Since the upper surface 12a of the insulating layer 12 is the roughened surface as described above, an adhesion property between the upper surface 12a of the insulating layer 12 and the solder resist layer 19 which is formed on the upper surface 12a can be enhanced. Although high roughness is preferable from the viewpoint of the adhesion property to the solder resist layer 19, increasing the roughness in the regions E decreases the thickness of the insulating layer 12 there, which may impair functions such as insulation and crack prevention. In view of this, in this exemplary embodiment, in order to secure such functions, the regions E are formed to be smaller in roughness than the regions F, whereby the adhesion property to the solder resist layer 19 is secured mainly by the regions F.

In this exemplary embodiment, the upper surface 12a of the insulating layer 12 is the roughened surface, and the regions E are formed to be smaller in roughness than the regions F. Alternatively, since the adhesion property to the solder resist layer 19 can be secured mainly by the regions F, the regions E may be formed to be a smooth surface (Ra is equal to or larger than about 0.1 µm and smaller than about 0.2 µm) rather than a roughened surface. In this case, only the regions F are roughened surfaces on the upper surface 12a of the insulating layer 12.

The pads 11 are embedded in the first recess portions 12y of the insulating layer 12. An upper surface 11a of each pad 11 is exposed to inside of the corresponding first recess portion 12y which is formed in the upper surface 12a of the insulating layer 12. More specifically, the upper surface 11a of each pad 11 is exposed to the inside of the corresponding first recess portion 12y so as to be located at a position that is lower than the upper surface 12a of the insulating layer 12. Therefore, a step portion Z where an inner wall surface of the first recess portion 12y is exposed is formed between the upper surface 11a of the pad 11 and the upper surface 12a of the insulating layer 12. A part, in the step portion Z, of the inner wall surface of the first recess portion 12y is roughened so as to have approximately the same roughness as or a lower roughness than the region E.

For example, each pad 11 may have a circular shape in plan view and a tapered shape in section. A width of the tapered shape is narrower in a vicinity of a bottom surface of the pad 11 than a width of the tapered shape in a vicinity of the upper surface 12a of the insulating layer 12. Each pad 11 may have, for example, an inverted cone frustum shape. A central portion (a region inside an upper peripheral portion 11y) of each pad 11, excluding the peripheral portion 11y of each pad 11, is formed with a second recess portion 11x having a smooth bottom surface and a smooth inner wall surface. For example, the roughness Ra of the bottom surface (smooth surface) of the second recess portion 11x may be equal to or higher than about 0.1 µm and lower than about 0.2 µm. The inner wall surface (smooth surface) of the second recess portion 11x is formed by a similar process to a process for its bottom surface. Therefore, the roughness of the inner wall surface of the second recess portion 11x can be approximately the same as that of its bottom surface. For convenience of description, the bottom surface and the inner wall surface will be described together.

A material of the pads 11 may be copper, and a thickness T of the pads 11 may be about 10 µm, for example. For example, a depth $D_1$ of the second recess portion 11x as measured from the upper peripheral portion 11y of each pad 11 may be in a range of about 1 to 2 µm.

A lower surface 11c and a side surface 11b, which are in contact with the insulating layer 12, of each pad 11 are a roughened surface. This provides an anchor effect, whereby an adhesion property between the pads 11 and the insulating layer 12 can be enhanced and peeling-off or a crack between the insulating layer 12 and the wiring layer 13 due to stress can be prevented. For example, the roughness Ra of the lower surface 11c of each pad 11 may be equal to or higher than about 0.2 μm and lower than about 0.3 μm. Since the side surface 11b (roughened surface) of each pad 11 is formed by a similar process to a process for its lower surface 11c, the roughness of the side surface 11b of each pad 11 can be approximately the same as that of its lower surface 11c. For convenience of description, the lower surface 11c and the side wall surface 11b will be described together.

The upper peripheral portion 11y (the surface being in contact with a protrusion portion of a lower surface of the solder resist layer 19) of each pad 11 is a roughened surface. For example, the roughness Ra of the upper peripheral portion 11y of each pad 11 may be equal to or higher than about 0.5 μm and lower than about 0.8 μm. This provides an anchor effect, whereby the adhesion property between the pads 11 and the solder resist layer 19 can be enhanced.

Each wiring pattern 21 is embedded in the corresponding first recess portion 12y of the insulating layer 12. An upper surface 21a of each wiring pattern 21 is exposed to inside of the corresponding first recess portion 12y which is formed in the upper surface 12a of the insulating layer 12. The upper surface 21a of each wiring pattern 21 may be located at the same level as the upper surface 11a of each pad 11. Each wiring pattern 21 may have a tapered shape in section. A width of the tapered shape in a vicinity of a bottom surface of the wiring pattern 21 is narrower than a width of the tapered shape in a vicinity of the upper surface 12a of the insulating layer 12.

Each wiring pattern 21 may be in a similar form to the form of each pad 11. More specifically, the upper surface 21a of each wiring pattern 21 is exposed to the inside of the corresponding first recess portion 12y so as to be located at a position that is lower than the upper surface 12a of the insulating layer 12. Therefore, a step portion Z where an inner wall surface of the first recess portion 12y is exposed is formed between the upper surface 21a of the wiring pattern 21 and the upper surface 12a of the insulating layer 12. A part, in the step portion Z, of the inner wall surface of the first recess portion 12y is roughened so as to have approximately the same roughness as or a lower roughness than the region E. A material of the wiring patterns 21 may be copper, and the wiring patterns 21 may be, for example, about 10 μm in thickness.

A lower surface 21c and a side surface 21b, which are in contact with the insulating layer 12, of each wiring pattern 21 are roughened surfaces. This provides an anchor effect, whereby the adhesion property among the wiring patterns 21, the insulating layer 12, and the solder resist layer 19 can be enhanced. For example, the roughness Ra of the lower surface 21c of each wiring pattern 21 may be equal to or higher than about 0.2 μm and lower than about 0.3 μm. Since the side surface 21b (roughened surface) of each wiring pattern 21 is formed by a similar process to a process for its lower surface 21c, the roughness of the side surface 21b of each wiring pattern 21 can be approximately the same as that of its lower surface 21c. For convenience of description, the lower surface 21c and the side wall surface 21b will be described together. The upper surface 21a of each wiring pattern 21 is a roughened surface. For example, the roughness Ra of the upper surface 21a of each wiring pattern 21 may be equal to or higher than about 0.5 μm and lower than about 0.8 μm.

Since the upper peripheral surfaces 11y of the pads 11 and the upper surfaces 21a of the wiring patterns 21 are higher in roughness than the regions F of the upper surface 12a of the insulating layer 12, the adhesion property between the solder resist layer 19 and the pads 11/wiring patterns 21 can be enhanced to a large extent. This makes it possible to compensate for the configuration that the regions E of the upper surface 12a of the insulating layer 12 are smaller in roughness than the regions F, and thereby provides, for example, such an advantage that an adjacent portion of the solder resist layer 19 to a peripheral portion of each opening portion 19x can be prevented from peeling off the insulating layer 12.

The solder resist layer 19 is formed on the upper surface 12a of the insulating layer 12. The solder resist layer 19 is formed with the opening portions 19x through which the respective second recess portions 11x of the pads 11 are exposed. Each opening portion 19x has, for example, a circular shape in plan view. The portion of the solder resist layer 19 adjacent to each opening portion 19x extends to the inside of the corresponding first recess portion (12y) so as to cover the inner wall surface (step portion Z) of the corresponding first recess portion 12y and the upper peripheral portion 11y of the corresponding pad 11. The solder resist layer 19 which covers the upper peripheral portion 11y of each pad 11 protrudes from the peripheral portion 11y of each pad 11 laterally (in a horizontal direction; toward a center of each pad 11) so as to cover above the second recess portion 11x of each pad 11. More specifically, the solder resist layer 19 protrudes from the peripheral portions 11y of the pads 11 laterally so as to have eave shapes that cover above the second recess portions 11x of the pads 11. A width $W_1$ of the eave-shape protrusion portion of the solder resist layer 19 over the second recess portion 11x may be about 1 to 2 μm, for example.

Referring back to FIG. 1A, the solder resist layer 19 extends into the first recess portions 12y so as to cover the upper surfaces 21a of the wiring patterns 21. However, the invention is not limited thereto. For example, the solder resist layer 19 may be formed with opening portions through which the wiring patterns 21 are exposed. A material of the solder resist layer 19 may be a photosensitive epoxy-based insulating resin. The solder resist layer 19 may be, for example, about 15 to 35 μm in thickness.

Since the solder resist layer 19 covers the upper peripheral portions 11y of the pads 11 as described above, the pads 11 can be prevented from coming off due to stress that occurs when a semiconductor chip or the like is mounted as compared the case where the solder resist layer 19 does not cover the upper peripheral portions 11y of the pads 11. Also, since each pad 11 is embedded in the corresponding first recess portion 12y of the insulating layer 12 and the solder resist layer 19 covers the inner wall surface of each first recess portion 12y, a contact area between the solder resist layer 19 and the insulating layer 12 can be increased by a contact area between the solder resist layer 19 and the inner wall surfaces of the insulating layer 12, whereby the pads 11 can be prevented even more reliably from coming off.

Also, the solder resist layer 19 protrudes toward the center portion of each pad 11 so as to cover above the second recess portion 11x. Therefore, when solder or the like is formed in the second recess portions 11x in mounting a semiconductor chip or the like, the protrusion portions of the solder resist layer 19 serves as wedges to prevent the solder or the like from coming off.

Each surface-treated layer 20 is formed in the corresponding second recess portion 11x exposed to a bottom portion of the opening portion 19x of the solder resist layer 19 so as to cover the bottom surface and inner wall surface of the second recess portion 11x and not to fill the second recess portion 11x. In other words, each surface-treated layer 20 has the bottom surface and the inner wall surface which conform in shape to the corresponding second recess portion 11x. Each surface-treated layer 20 may be an Au layer, an Ni/Au layer (a metal layer formed by stacking an Ni layer and an Au layer in this order), an Ni/Pd/Au layer (a metal layer formed by stacking an Ni layer, a Pd layer, and an Au layer in this order), or the like. Also, the surface-treated layers 20 may be formed by performing anti-oxidation treatment such as OSP (organic solderability preservative) treatment. The thickness of the surface-treated layers 20 may be, for example, in a range of about 0.5 to 1 μm.

The portions, formed with the surface-treated layers 20, of the pads 11 can be electrically connected to a semiconductor chip or the like. As described above, the bottom surface of each second recess portion 11x is a smooth surface rather than a roughened surface. Therefore, an upper surface of each surface-treated layer 20 which is formed on the bottom surface of the corresponding second recess portion 11x is also smooth. If the bottom surface of each second recess portion 11x were roughened surfaces, the thickness of each surface-treated layer 20 would readily vary due to the roughness of the bottom surface of each second recess portion 11x. To the contrary, in this exemplary embodiment, since the bottom surface of each second recess portion 11x is the smooth surface, the thickness of each surface-treated layer 20 can be made uniform.

As a result, the solder wettability is enhanced, for example, when electrodes of a semiconductor chip are connected to the respective surface-treated layers 20 via solder. Therefore, the reliability of connections between the wiring board 10 and the semiconductor chip can be enhanced.

The wiring layer 13 is formed under the insulating layer 12. The wiring layer 13 includes via wirings and wiring patterns. The via wirings fill respective via holes 12x which penetrate through the insulating layer 12 to expose the lower surfaces 11c of the pads 11. The wiring patterns are formed on a lower surface of the insulating layer 12. Each via hole 12x may be a recess portion having such a cone frustum shape that a diameter of an opening portion thereof which opens to the insulating layer 14 side is larger than that of a bottom surface of an opening portion thereof through which the lower surface 11c of the pad 11 is exposed. In other words, each via wiring that is connected to the lower surface 11c of the corresponding pad 11 has a tapered section shape that is wider on an opposite side to the upper surface 12a of the insulating layer 12 than on the upper surface 12a side of the insulating layer 12.

The wiring layer 13 is electrically connected to the pads 11 exposed to the bottom portions of the via holes 12x. A material of the wiring layer 13 may be copper (Cu). The wiring patterns of the wiring layer 13 may be, for example, about 10 to 20 μm in thickness. There may be pads 11 that are not connected to any via wirings of the wiring layer 13. Also, there may be wiring patterns 21 that are connected to the via wirings of the wiring layer 13.

The insulating layer 14 is formed on a lower surface of the insulating layer 12 so as to cover the wiring layer 13. The insulating layer 14 may be made of the same insulating resin as the insulating layer 12. The insulating layer 14 may contain a filler such as silica ($SiO_2$). The insulating layer 14 may be, for example, about 15 to 35 μm in thickness.

The wiring layer 15 is formed under the insulating layer 14. The wiring layer 15 includes via wirings and wiring patterns. The via wirings fill respective via holes 14x which penetrate through the insulating layer 14 to expose a lower surface of the wiring layer 13. The wiring patterns are formed on a lower surface of the insulating layer 14. Each via hole 14x may be a recess portion having such a cone frustum shape that a diameter of one opening portion thereof which opens to the insulating layer 16 side is larger than that of a bottom surface, formed by the lower surface of the wiring layer 13, of the other opening portion thereof.

The wiring layer 15 is electrically connected to the wiring layer 13 exposed to a bottom portion of the via holes 14x. A material of the wiring layer 15 may be copper (Cu). The wiring patterns of the wiring layer 15 may be, for example, about 10 to 20 μm in thickness.

The insulating layer 16 is formed on a lower surface of the insulating layer 14 so as to cover the wiring layer 15. The insulating layer 16 may be made of the same insulating resin as the insulating layer 12. The insulating layer 16 may contain a filler such as silica ($SiO_2$). The insulating layer 16 may be, for example, about 15 to 35 μm in thickness.

The wiring layer 17 is formed under the insulating layer 16. The wiring layer 17 includes via wirings and wiring patterns. The via wirings fill respective via holes 16x which penetrate through the insulating layer 16 to expose the lower surface of the wiring layer 15. The wiring patterns are formed on a lower surface of the insulating layer 16. Each via hole 16x may be a recess portion having such a cone frustum shape that a diameter of an opening portion thereof which opens to the solder resist layer 18 side is larger than that of a bottom surface, formed by the lower surface of the wiring layer 15, of an opening portion thereof.

The wiring layer 17 is electrically connected to the wiring layer 15 exposed to the bottom portions of the via holes 16x. A material of the wiring layer 17 may be copper (Cu). The wiring patterns of the wiring layer 17 may be, for example, about 10 to 20 μm in thickness.

The solder resist layer 18 is formed on a lower surface of the insulating layer 16 so as to cover the wiring layer 17. The solder resist layer 18 is formed with opening portions 18x. Portions of the wiring layer 17 are exposed through bottom portions of the opening portions 18x. The wiring layer 17, exposed through the bottom portions of the opening portions 18x, serve as pads to be electrically connected to another wiring board, a semiconductor package, or the like. A material of the solder resist layer 18 may be a photosensitive epoxy-based insulating resin. The solder resist layer 18 may be, for example, about 15 to 35 μm in thickness.

If necessary, metal layers may be formed on a lower surface of the wiring layer 17 which is exposed through the bottom portions of the opening portions 18x. The metal layers may be of the same configuration as the above-described surface-treated layers 20. The lower surface of the wiring layer 17 which is exposed through the bottom portions of the opening portions 18x may be subjected to anti-oxidation treatment such as OSP treatment.

In the wiring board 10, a part of the wiring patterns of the wiring layer 17 may be formed so as to extend to the lower surface of the insulating layer 16, the part of the wiring patterns extended to the lower surface of the insulating layer 16 may be exposed through the opening portions 18x of the solder resist layer 18 so as to serve as pads. That is, portions, other than the wiring lines filling the via holes 16x, of the wiring layer 17 may serve as pads.

[Method for Manufacturing Wiring Board According to Exemplary Embodiment]

Next, a method for manufacturing a wiring board according to this exemplary embodiment will be described. FIGS. 2A to 6C are section views illustrating processes for manufacturing the wiring board according to this exemplary embodiment. In this exemplary embodiment, plural parts to become plural wiring boards are formed on a support body and are divided into individual parts after removal of the support body. However, one wiring board may be formed on a support body, and the support body may be removed thereafter.

Figure 2A:
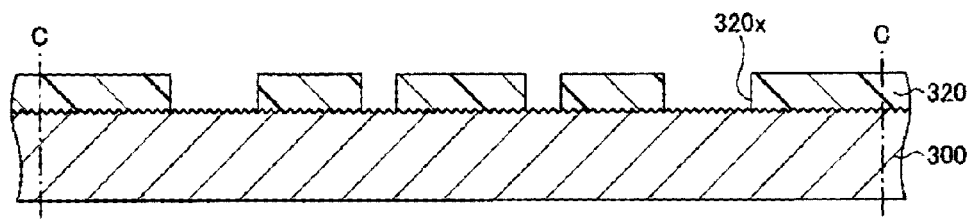
FIGS. 2A to 2C are a first set of section views illustrating a manufacturing process of a wiring board according to the exemplary embodiment.

First, in a step of FIG. 2A, a support body 300 one surface of which is smooth is prepared, and the one surface of the support body 300 is roughened. For example, the roughness Ra of the one surface may be equal to or higher than about 0.3 μm and lower than about 0.5 μm. A resist layer 320 having opening portions 320x in pad 11 forming regions and wiring pattern 21 forming regions is formed on the one surface (roughened surface) of the support body 300.

The support body 300 may be a silicon plate, a glass plate, a metal plate, a metal foil, or the like. In this exemplary embodiment, the support body 300 is a copper foil. This is because the copper foil can be used as a power supply layer when electrolytic plating is performed in later steps such as steps of FIGS. 2C and 3A and can be easily removed by etching in a later step of FIG. 5B. The support body 300 may be, for example, about 35 to 100 μm in thickness. The one surface of the support body 300 may be roughened with, for example, a formic-acid-based or acetic-acid-based etching solution. However, the method for roughening the one surface of the support body 300 is not limited thereto but may be any of other methods such as blasting.

To form the resist layer 320, a resist in liquid or paste resist made of, for example, a photosensitive resin composition containing an epoxy-based resin or an acrylic-based resin is applied to the one surface of the support body 300. Alternatively, a film resist (e.g., dry film resist) made of, for example, a photosensitive resin composition containing an epoxy-based resin or an acrylic-based resin is laminated on the one surface of the support body 300.

Then, opening portions 320x are formed by exposing the applied or laminated resist to light and developing the applied or laminated resist. As a result, the resist layer 320 having the opening portions 320x is formed on the one surface of the support body 300. Alternative, a film resist which has been formed with opening portions 320x in advance may be laminated on the one surface of the support body 300. The opening portions 320x in the pad 11 forming regions may have, for example, a circular shape in plan view.

Figure 2B:
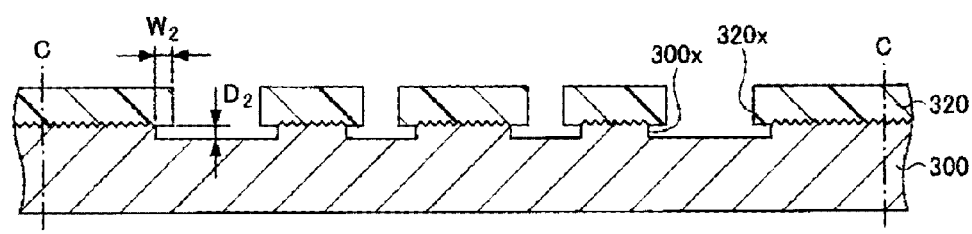

In the subsequent step of FIG. 2B, portions of the support body 300 which are exposed to inside of the opening portions 320x are removed, to thereby form recess portions 300x. The support body 300 which is the copper foil can be removed by, for example, wet etching using a ferric chloride solution, a cupric chloride solution, a ammonium persulfate solution, or the like. Since the etching proceeds not only vertically but also horizontally, an inner wall surface of each recess portion 300x is formed so as to deviate from the inside of the corresponding opening portion 320x to a portion covered by the resist layer 320.

That is, in a plan view, each recess portion 300x is formed so that its peripheral portion is located on an outside of the corresponding opening portion 320x. For example, if the opening portion 320x has a circular shape in plan view, the recess portion 300x is formed to have a circular shape in plan view and to be larger in diameter than the opening portion 320x. Since the etching proceeds approximately at the same rate in the vertical direction and the horizontal direction, a width $W_2$ of the portion, covered by the resist layer 320, of each recess portion 300x is approximately equal to a depth $D_2$ of the recess portion 300x. The width $W_2$ and the depth $D_2$ may be, for example, about 2 μm. Also, the width $W_2$ corresponds to the regions E shown in FIGS. 1B and 1C.

Figure 2C:
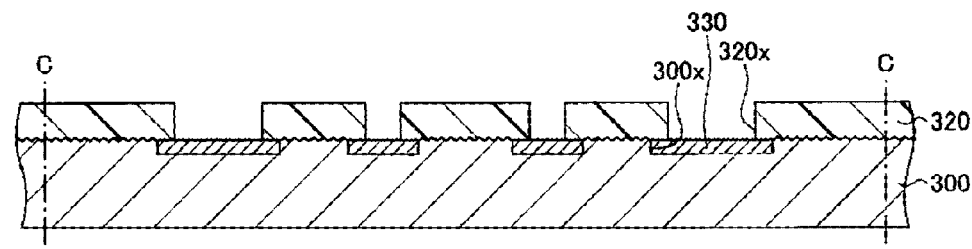

In the subsequent step of FIG. 2C, a metal layer 330 (barrier layer) which fills the recess portions 300x is formed by, for example, electrolytic plating using the support body 300 as a plating power supply layer. One surface (a surface exposed through the openings 300x) of the metal layer 330 may be flush with the one surface of the support body 300. For example, the metal layer 330 may be made of such a material as not to be removed when the support body 300 is removed by etching in a later step. In this exemplary embodiment, since the support body 300 is the copper foil, the metal layer 330 may be made of nickel (Ni) which is not removed with a copper etching solution. The metal layer 330 may be, for example, about 2 μm in thickness.

More specifically, for example, the metal layer 330 (nickel layer) may be formed by electrolytic plating using a plating solution that is a mixture of nickel sulfate, boric acid, nickel chloride, etc. In this case, by adjusting the composition of the used plating solution and the current density, the one surface of the metal layer 330 formed by the electrolytic plating is roughened and formed with minute asperities. For example, the roughness Ra of the one surface of the metal layer 330 may be equal to or higher than about 0.2 μm and lower than about 0.3 μm. In this exemplary embodiment, the composition of the used plating solution and the current density in forming the metal layer 330 (nickel layer) are adjusted so that the roughness of the one surface of the metal layer 330 becomes lower than that of the one surface of the support body 300.

Figure 3A:
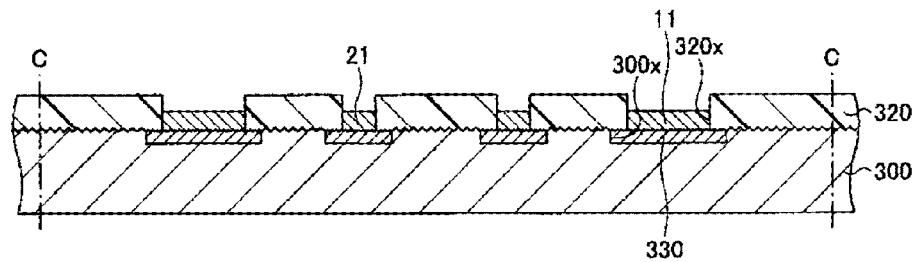
FIGS. 3A to 3C are a second set of section views illustrating the manufacturing process of the wiring board according to the exemplary embodiment.

In the subsequent step of FIG. 3A, pads 11 and wiring patterns 21 are formed by, for example, electrolytic plating using the support body 300 as a plating power supply layer, so as to extend from a top surface of the metal layer 330, which fills the recess portions 300x, to an inside of the opening portions 320x. That is, the pads 11 and the wiring patterns 21 are stacked on the one surface, exposed to the inside of the opening portions 320x, of the metal layer 330. A material of the pads 11 and the wiring patterns 21 may be copper (Cu). The pads 11 and the wiring patterns 21 may be, for example, about several tens of micrometers.

Figure 3B:
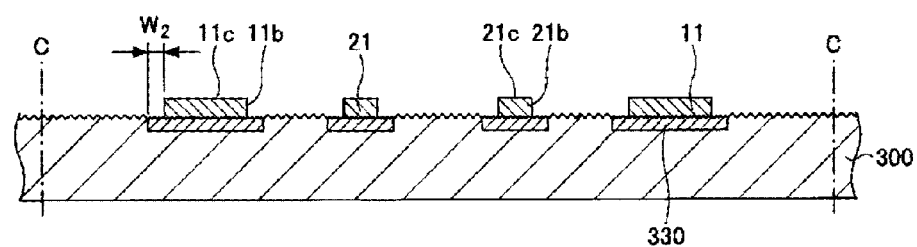

In the subsequent step of FIG. 3B, the resist layer 320 is removed. As a result, the one surface of the support body 300, the one surface of the metal layer 330, the lower surfaces 11c and side surfaces 11b of the pads 11, and the lower surfaces 21c and side surfaces 21b of the wiring patterns 21 are exposed. It is noted that although FIGS. 3B to 5C illustrate that the surfaces 11c of the first pads 11 and the surfaces 21c of the wiring patterns 21 are located on an upper side of the first pads 11 and an upper side of the wiring patterns 21, respectively, the surfaces 11c, 21c will be referred to as "lower surfaces" for the sake of convenience. This is because FIGS. 1A, 1B, and 6A to 6C illustrate that the surfaces 11c, 21c are located on an upper side of the first pads 11 and an upper side of the wiring patterns 21, respectively. Similarly, the surfaces 11a of the first pads 11 and the surfaces 21a of the wiring patterns 21 will be referred to as "upper surfaces" for the sake of convenience. With regard to the metal layer 330, portions (having the width $W_2$), adjacent to peripheral portions (outer peripheries) of the pads 11 and wiring patterns 21, of the one surface of the metal layer 330 is exposed.

Figure 3C:
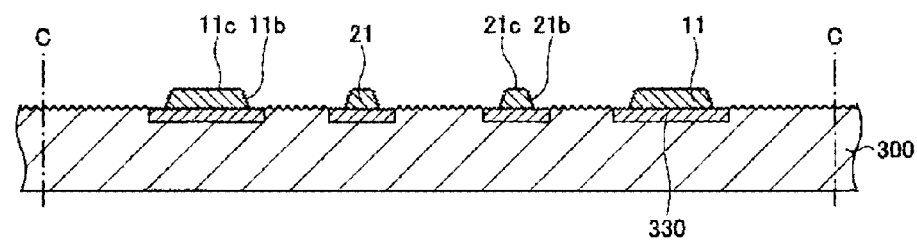

In the subsequent step of FIG. 3C, the exposed lower surfaces 11c and side surfaces 11b of the pads 11 and the exposed lower surfaces 21c and side surfaces 21b of the wiring patterns 21 are roughened by etching. For example, the roughness Ra of the lower surfaces 11c of the pads 11 and the lower surfaces 21c of the wiring patterns 21 may be equal to or higher than about 0.2 μm and lower than about 0.3 μm. The roughness Ra of the side surfaces 11b of the pads 11 and the side surfaces 21b of the wiring patterns 21 may be approximately the same as the lower surfaces 11c of the pads 11 and the lower surfaces 21c of the wiring patterns 21.

The roughening may be performed using, for example, a formic-acid-based or acetic-acid-based etching solution. The etching removes a part of the lower surfaces 11c and side surfaces 11b of the pads 11 and a part of the lower surfaces 21c and side surfaces 21b of the wiring patterns 21. As a result, the side surfaces 11b of the pads 11 and the side surfaces 21b of the wiring patterns 21 become slant surfaces. For example, if each pad 11 is cylindrical before the etching, each pad 11 has a cone frustum shape after the etching.

When the pads 11 and the wiring patterns 21 are etched so as to be roughened, the one surface of the support member 300 is also subjected to the etching. As a result, the roughness of the one surface of the support member 300 is increased. On the other hand, the metal layer 330 (nickel layer) is less etched than the pads 11, the wiring patterns 21, and the support body 300. As a result, the difference in roughness between the support body 300 and the metal layer 330 is increased.

Figure 4A:
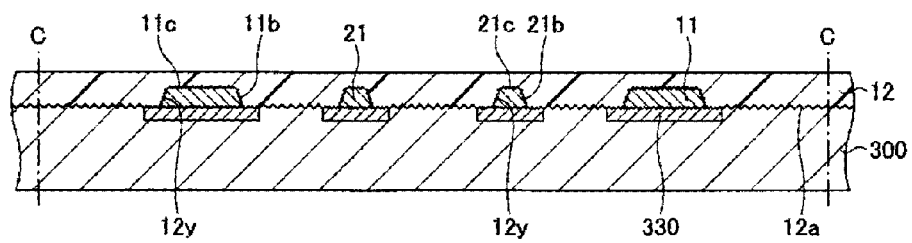
FIGS. 4A to 4C are a third set of section views illustrating the manufacturing process of the wiring board according to the exemplary embodiment.

In the subsequent step of FIG. 4A, an insulating layer 12 is formed on the one surface of the support body 300 so as to cover a part of the pads 11 (the lower surfaces 11c and side surfaces 11b of the pads) and a part of the wiring patterns 21 (the lower surfaces 21c and side surfaces 21b of the wiring patterns 21). As this occurs, the other surface 12a of the insulating layer 12 is formed with first recess portions 12y that conform in shape to the pads 11 and the wiring patterns 21. For example, the insulating layer 12 may be made of a material having, as the main component, an insulating resin such as a thermosetting epoxy-based resin. The insulating layer 12 may contain a filler such as silica ($SiO_2$). The insulating layer 12 may be, for example, about 15 to 35 μm in thickness.

If the insulating layer 12 is made of a thermosetting film insulating resin such as a epoxy-based resin, the film insulating resin being in a partially cured state is laminated on the one surface of the support body 300 so as to cover the pads 11 and the wiring patterns 21. The laminated insulating resin is cured by heating it to a temperature higher than its curing temperature while pressing it. Laminating the insulating resin in a vacuum atmosphere can prevent inclusion of voids.

If the insulating layer 12 is made of a thermosetting liquid or paste insulating resin such as an epoxy-based resin, the liquid or paste insulating resin is applied to the one surface of the support body 300 by, for example, spin coating so as to cover the pads 11 and the wiring patterns 21. Then, the applied insulating resin is cured by heating it to a temperature higher than its curing temperature.

Figure 4B:
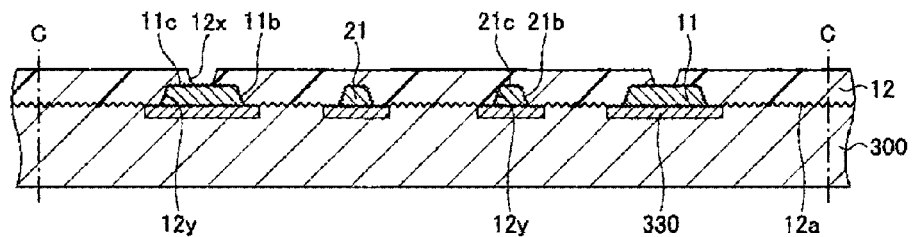

In the subsequent step of FIG. 4B, via holes 12x are formed so as to pass through the insulating layer 12 and to expose the lower surfaces 11c of the pads 11. The via holes 12x are formed by, for example, laser processing using a $CO_2$ laser or the like. Each via hole 12x formed by the laser processing is a recess portion having such an inverted cone frustum shape that one opening portion thereof which opens on the side where the insulating layer 14 is to be formed is larger in diameter than a bottom portion, formed by the lower surface 11c of the corresponding pad 11, of the other opening portion thereof.

If other via holes are formed by the laser processing, they are similar in shape to the via holes 12x. If the via holes 12x are formed by the laser processing, it is preferable to perform desmearing to remove resin residues of the insulating layer 12 that adheres to the lower surfaces 11c, exposed to the bottom portions of the via holes 12x, of the pads 11.

Figure 4C:
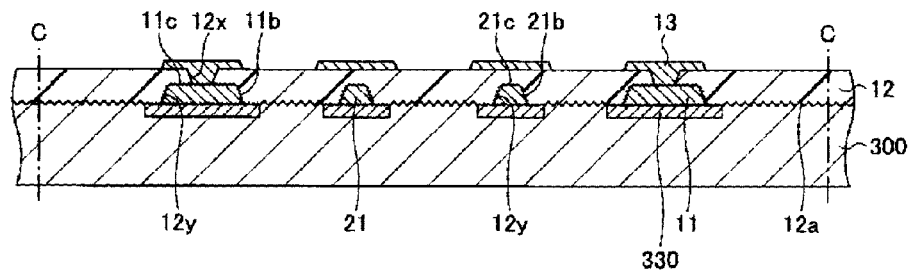

In the subsequent step of FIG. 4C, a wiring layer 13 is formed on the insulating layer 12. The wiring layer 13 includes via wirings that fill the respective via holes 12x and wiring patterns formed on one surface of the insulating layer 12. The wiring layer 13 is electrically connected to the pads 11 which are exposed to the bottom portions of the respective via holes 12x. A material of the wiring layer 13 may be copper (Cu). The wiring layer 13 may be formed by any of various wiring formation methods such as a semi-additive method and a subtractive method.

Figure 5A:
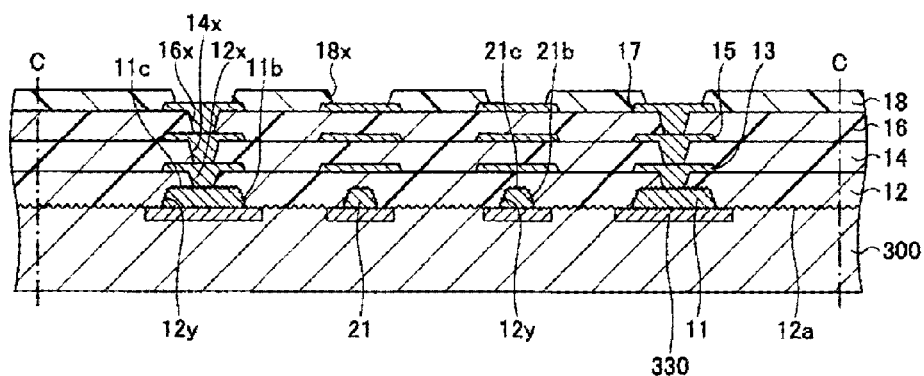
FIGS. 5A to 5C are a fourth set of section views illustrating the manufacturing process of the wiring board according to the exemplary embodiment.

In the subsequent step of FIG. 5A, an insulating layer 14, a wiring layer 15, an insulating layer 16, a wiring layer 17, and a solder resist layer 18 are stacked on one side of the insulating layer 12 by repeatedly performing steps that are the same as or similar to the above-described steps. That is, after an insulating layer 14 is formed on the one surface of the insulating layer 12 so as to cover the wiring layer 13, via holes 14x are formed so as to pass through the insulating layer 14 and to expose one surface of the wiring layer 13. The insulating layer 14 may be made of the same insulating resin as the insulating layer 12. The insulating layer 14 may contain a filler such as silica ($SiO_2$). The insulating layer 14 may be, for example, about 15 to 35 μm in thickness.

The wiring layer 15 is formed on one side of the insulating layer 14 so as to be electrically connected to the wiring layer 13 through via holes 14x. The wiring layer 15 includes via wirings that fill the via holes 14x and wiring patterns formed on one surface of the insulating layer 14. The wiring layer 15 is electrically connected to the wiring layer 13 that is exposed to bottom portions of the via holes 14x. A material of the wiring layer 15 may be copper (Cu). The wiring layer 15 is formed by a semi-additive method, for example. Wiring patterns constituting the wiring layer 15 may be, for example, about 10 to 20 μm in thickness.

After the insulating layer 16 is formed on the one surface of the insulating layer 14 so as to cover the wiring layer 15, via holes 16x are formed so as to pass through the insulating layer 16 and to expose one surface of the wiring layer 15. The insulating layer 16 may be made of the same insulating resin as the insulating layer 12. The insulating layer 16 may contain a filler such as silica ($SiO_2$). The insulating layer 16 may be, for example, about 15 to 35 μm in thickness.

The wiring layer 17 is formed on one side of the insulating layer 16 so as to be electrically connected to the wiring layer 15 through via holes 16x. The wiring layer 17 includes via wirings that fill the via holes 16x and wiring patterns formed on one surface of the insulating layer 16. The wiring layer 17 is electrically connected to the wiring layer 15 that is exposed to bottom portions of the via holes 16x. A material of the wiring layer 17 may be copper (Cu). The wiring layer 17 is formed by a semi-additive method, for example. Wiring patterns constituting the wiring layer 17 may be, for example, about 10 to 20 μm in thickness.

Thus, the prescribed build-up wiring layers are formed on the one surface of the support body 300. In this exemplary embodiment, the three build-up wiring layers (the wiring layers 13, 15, and 17) are formed. However, n build-up wiring layers may be formed (n is an integer equal to or larger than 1).

Next, a solder resist layer 18 is formed on the one surface of the wiring layer 16 so as to cover the wiring layer 17. For example, the solder resist layer 18 may be formed by applying a photosensitive epoxy-based liquid or paste insulating resin on the one surface of the insulating layer 16 by screen printing, roll coating, spin coating, or the like, so as to cover the wiring layer 17. Alternatively, for example, the solder resist layer 18 may be formed by laminating a photosensitive epoxy-based film insulating resin on the one surface of the insulating layer 16 so as to cover the wiring layer 17.

Then, the opening portions 18x are formed by exposing the applied or laminated insulating resin to light and developing the applied or laminated insulating resin (photolithography). Thereby, the solder resist layer 18 having the opening portions 18x is formed. Alternatively, a film insulating resin that has been formed with the opening portions 18x in advance may be laminated on the one surface of the insulating layer 16 so as to cover the wiring layer 17. The solder resist layer 18 may be made of a non-photosensitive insulating resin. In this case, after the solder resist layer 18 is formed on the one surface of the insulating layer 16 and cured, the opening portions 18x may be formed by laser processing using a $CO_2$ laser or the like or blasting using an abrasive agent such as alumina abrasive grains.

Parts of the wiring layer 17 are exposed to the inside of the opening portions 18x. The wiring layer exposed to the inside of the opening portions 18x serve as pads to be electrically connected another wiring board, a semiconductor package, or the like.

If necessary, a metal layer may be formed by electroless plating or the like on one surface of the wiring layer 17 that is exposed to bottom portions of the respective opening portions 18x. The metal layer may be of the same type as described above. Also, the one surface, exposed to the bottom portions of the opening portions 18x, of the wiring layer 17 may be subjected to anti-oxidation treatment such as OSP treatment.

Figure 5B:
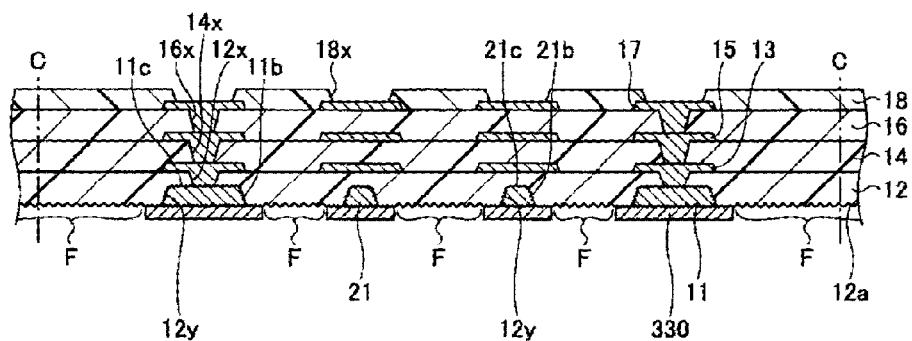

In the subsequent step of FIG. 5B, the support body 300 shown in FIG. 5A is removed. As a result, the metal layers 330 are exposed through (protrude from) the other surface 12a of the insulating layer 12. The roughened surface of the support body 300 is transferred to the regions F on the other surface 12a of the insulating layer 12. For example, the roughness Ra in the regions F may be equal to or higher than about 0.3 μm and lower than about 0.5 μm. The support body 300 which is the copper foil may be removed by, for example, wet etching using a ferric chloride solution, a cupric chloride solution, an ammonium persulfate solution, or the like. Since the metal layers 330 are made of the metal (e.g., nickel (Ni)) that is not removed by a copper etching solution, only the support body 300 (copper foil) can be selectively removed by etching with respect to the metal layers 330. That is, the metal layers 330 serve as etching stop layers (barrier layers).

Figure 5C:
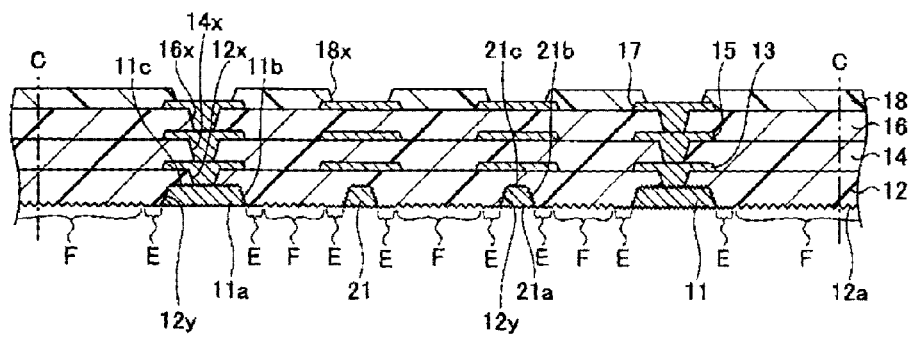

In the subsequent step of FIG. 5C, the metal layers 330 shown in FIG. 5B are removed. As a result, the upper surfaces 11a of the pads 11 and the upper surfaces 21a of the wiring patterns 21 are exposed from the other surface 12a of the insulating layer 12. The upper surfaces 11a are located on an opposite side of the pads 11 to the lower surfaces 11c. Also, the upper surfaces 21a are located on an opposite side of the wiring patterns 21 to the lower surfaces 21c. The roughened surfaces of the metal layers 330 are transferred to the upper surfaces 11a of the pads 11 and the upper surfaces 21a of the wiring patterns 21. Also, the roughened surfaces of the metal layers 330 are transferred to the regions E on the other surface 12a of the insulating layer 12. For example, the roughness Ra of the upper surfaces 11a of the pads 11, the upper surfaces 21a of the wiring patterns 21, and the regions E may be equal to or higher than about 0.2 μm and lower than about 0.3 μm. The other surface 12a of the insulating layer 12 may be flush with the upper surfaces 11a of the pads 11 and the upper surfaces 21a of the wiring patterns 21.

Because of the above-described steps, in this exemplary embodiment, surfaces, exposed to adjacent portions to the peripheral portions (outer peripheries) of the pads 11 and the wiring patterns 21, of the metal layer 330 are lower in roughness than the one surface of the support body 300. Therefore, the adjacent portions (regions E) of the other surface 12a of the insulating layer 12 to the peripheral portions of the pads 11 and the wiring patterns 21 are lower in roughness than the other portions (regions F) of the other surface 12a of the insulating layer 12.

If the metal layer 330 is made of, for example, nickel (Ni), it can be removed by wet etching using a hydrogen peroxide/ nitric acid-based solution (i.e., a solution containing hydrogen peroxide and nitric acid), for example. Since the pads 11 and the wiring patterns 21 are made of the metal (e.g., copper (Cu)) that is not removed by a nickel etching solution, only the metal layer 330 made of nickel can be selectively removed by etching with respect to the pads 11 and the wiring patterns 21. That is, the pads 11 and the wiring patterns 21 serve as etching stop layers.

Figure 6A:
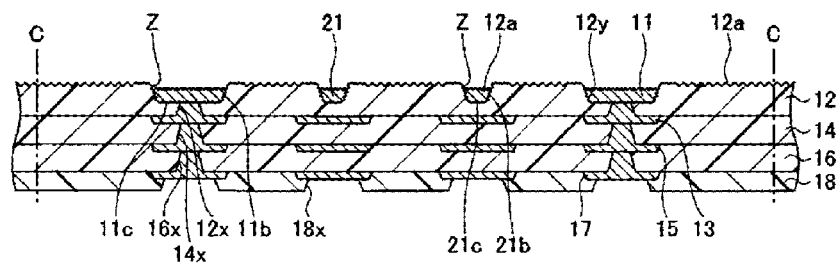
FIGS. 6A to 6C are a fifth set of section views illustrating the manufacturing process of the wiring board according to the exemplary embodiment.

In the subsequent step of FIG. 6A, parts, exposed from the insulating layer 12, of the pads 11 are removed. Thereby, step portions Z are formed where the inner wall surfaces of first recess portions 12y of the insulating layer 12 are exposed. Also, the upper surfaces of the pads 11 are roughened. At the same time, portions, exposed from the insulating layer 12, of the wiring patterns 21 are removed. Thereby, step portions Z are formed where the inner wall surfaces of the first recess portions 12y of the insulating layer 12 are exposed. Also, the upper surfaces of the wiring patterns 21 are roughened.

For example, the upper surface 11a of each pad 11 is etched so as to be exposed to the inside of the corresponding first recess portion 12y and to be located at a lower position than the upper surface 12a of the insulating layer 12. As a result, the step portion Z where the inner wall surface of the first recess portion 12y is exposed is formed between the upper surface 11a of the pad 11 and the upper surface 12a of the insulating layer 12. Likewise, the upper surface 21a of each wiring pattern 21 is etched so as to be exposed in the corresponding first recess portion 12y and to be located at a lower position than the upper surface 12a of the insulating layer 12. As a result, the step portion Z where the inner wall surface of the first recess portion 12y is exposed is formed between the upper surface 21a of the wiring pattern 21 and the upper surface 12a of the insulating layer 12.

For example, the roughness Ra of the upper surfaces of the pads 11 and the wiring patterns 21 may be equal to or higher than about 0.5 μm and lower than about 0.8 μm. Portions, in the step portions Z, of the inner wall surfaces of the first recess portions 12y are also roughened so as to have roughness that is approximately the same as or lower than the roughness of the regions E.

For example, a formic-acid-based or acetic-acid-based etching solution may be used to form the step portions Z and roughen the upper surfaces 11a of the pads 11 and the upper surfaces 21a of the wiring patterns 21. Each first recess portion 12y through which the corresponding pad 11 is exposed may have, for example, an inverted frustum cone shape that conforms to the shape of the pad 11. The step portions Z may be, for example, about 2 μm in depth. It is noted that FIGS. 6A to 6C are inverted with respect to FIGS. 2A to 5C in the top-bottom direction.

Figure 6B:
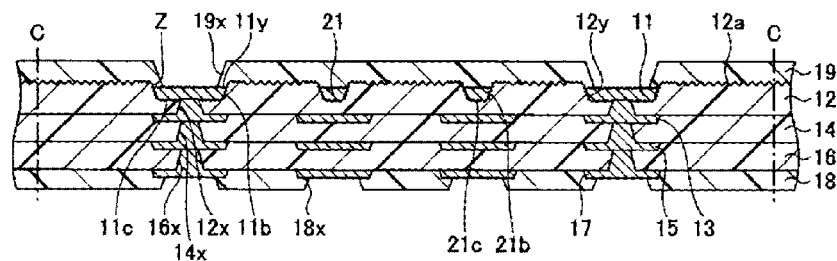

In the subsequent step of FIG. 6B, a solder resist layer 19 is formed on the one surface (upper surface) 12a of the insulating layer 12 so as to have opening portions 19x through which portions of the pads 11 are exposed. More specifically, the solder resist layer 19 and the opening portions 19x are formed so that a portion, adjacent to a peripheral portion of each opening portion 19x, of the solder resist layer 19 extends to an inside of the corresponding first recess portion 12y so as to cover the inner wall surface (step portion Z) of the first recess portion 12y and the upper peripheral portion 11y of the corresponding pad 11. For example, the solder resist layer 19 and the opening portions 19x may be formed by the same method as the solder resist layer 18 and the opening portions 18x.

Figure 6C:
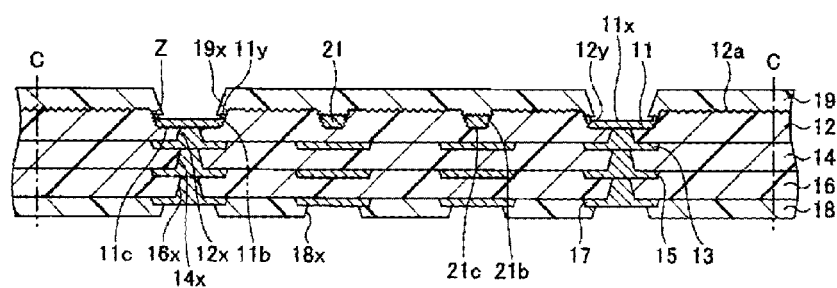

In the subsequent step of FIG. 6C, the second recess portions 11x are formed in the respective pads 11 as treatment to be performed before formation of the surface-treated layers 20. More specifically, the second recess portion 11x having a smooth bottom surface is formed by removing a part of each pad 11 exposed to an inside of the corresponding opening portion 19x of the solder resist layer 19. As a result, the adjacent portion of the solder resist layer 19 to the peripheral portion of each opening portion 19x protrudes from the upper peripheral portion 11y of the corresponding pad 11 laterally (toward a center portion of the corresponding pad 11) so as to have an eave shape that covers above the second recess portion 11x of the corresponding pad 11.

In this step, an etching solution is selected that does not make the surfaces of the second recess portions 11x be roughened surfaces. Therefore, the bottom surface and inner wall surface of each second recess portion 11x become smooth surfaces rather than roughened surfaces. For example, the roughness Ra of the bottom surface (smooth surface) of each second recess portion 11x may be equal to or higher than about 0.1 μm and lower than about 0.2 μm. The roughness of the inner wall surface (smooth surface) of each second recess portion 11x may be approximately the same as that of its bottom surface. If the pads 11 are made of copper, an etching solution such as a ferric chloride solution, a cupric chloride solution, or an ammonium persulfate solution may be selected. Since the etching proceeds not only vertically but also horizontally, the inner wall surface of each second recess portion 11x is formed so as to deviate from the inside of the corresponding opening portion 19x to a portion covered by the solder resist layer 19.

That is, in a plan view, each second recess portion 11x is formed so that its peripheral portion is located on an outside of the corresponding opening portion 19x. For example, if the opening portion 19x has a circular shape in plan view, the second recess portion 11x is formed to have a circular shape in plan view and to be larger in diameter than the opening portion 19x. Since the etching proceeds approximately at the same rate in the vertical direction and the horizontal direction, a width of the portion, covered by the solder resist layer formed 19, of each second recess portion 11x is approximately equal to a depth of the second recess portion 11x. The width and the depth may be, for example, about 2 μm.

After the step of FIG. 6C, the surface-treated layer 20 is formed on the bottom surface and inner wall surface of each second recess portion 11x. The resulting structure is cut at cutting positions C by dicing or the like into individual parts, whereby plural wiring boards 10 (see FIGS. 1A to 1C) are obtained. Metal layers (described above) are formed as the surface-treated layers 20 by electroless plating or the like. Alternatively, the surface-treated layers 20 may be formed by performing antioxidation treatment such as OSP treatment.

As described above, in the wiring board 10 according to this exemplary embodiment, since the bottom surfaces of the second recess portions 11x are the smooth surfaces, the upper surfaces of the surface-treated layers 20 formed on the bottom surfaces of the second recess portions 11x are smooth surfaces and hence can be made uniform in thickness. Therefore, the solder wettability is enhanced, for example, when electrodes of a semiconductor chip are connected to the respective surface-treated layers 20 via solder. Therefore, the reliability of connections between the wiring board 10 and the semiconductor chip can be enhanced.

Also, since the surfaces (the bottom surfaces 11c, 21c and the side surfaces 11b, 21b), being in contact with the insulating layer 12, of the pads 11 and the wiring patterns 21 are the roughened surfaces, they provide an anchor effect. As a result, the adhesion property between the pads 11/wiring patterns 21 and the insulating layer 12 can be enhanced, and peeling off or a crack between the insulating layer 12 and the wiring layer 13 due to stress can be prevented.

Also, since the upper peripheral surfaces 11y of the pads 11 are the roughened surfaces, they provide an anchor effect. As a result, the adhesion property between the pads 11 and the solder resist layer 19 can be enhanced.

Also, since the upper peripheral surfaces 11y of the pads 11 are covered with the solder resist layer 19, the pads 11 can be prevented from coming off due to stress that occurs when a semiconductor chip or the like is mounted. Since the inner wall surfaces (regions Z) of the first recess portions 12y are covered with the solder resist layer 19, the contact area between the solder resist layer 19 and the insulating layer 12 can be increased, which more reliably prevents the pads 11 from coming off.

Also, the solder resist layer 19 protrudes toward the center portion of each pad 11 so as to cover above the second recess portion 11x. Therefore, when solder or the like is formed in the second recess portions 11x in mounting a semiconductor chip or the like, the protrusion portions of the solder resist layer serve as wedges to prevent of solder or the like from coming off.

Also, the adjacent portions (regions E) of the upper surface 12a of the insulating layer 12 to the peripheral portions of the first recess portions 12y are lower in roughness than the other portions (regions F) of the upper surface 12a of the insulating layer 12, whereby the adhesion property to the solder resist layer 19 is secured mainly by the regions F. Therefore, the insulating layer 12 can be prevented from being decreased in thickness due to the increase of the roughness of the regions E, and functions such as insulation of the adjacent portions (regions E) to the peripheral portions of the first recess portions 12y and crack prevention can be secured.

Also, since the solder resist layers 18 and 19 are formed on both sides of the wiring board 10, the wiring board 10 is higher in rigidity than build-up boards of a related art in which a solder resist layer is formed on a single side. As a result, peeling off, a crack, or the like can be prevented from occurring at a boundary between an insulating layer and a wiring layer.

Also, since the solder resist layers 18 and 19 are formed on the both sides of the wiring board 10, the thermal expansion coefficients in the top-bottom direction (thickness direction) are better balanced, whereby the degree of a warp of the wiring board 10 due to a thermal history that the wiring board 10 has experienced can be lowered.

[Clauses]

This disclosure further encompasses various exemplary embodiments, for example, described below.

1. A method for manufacturing a wiring substrate, comprising:

roughening one surface of a support body;

forming a resist layer, having an opening portion, on the one surface of the support body;

removing a part of the support body exposed to an inside of the opening portion of the resist layer, to form a recess portion in the support body so that a peripheral portion of the recess portion is located on an outside of the opening portion of the resist layer in plan view;

forming a metal layer that fills the recess portion and has one surface exposed through the recess portion, wherein the one surface of the metal layer is smaller in roughness than the one surface of the support body;

forming a pad that extends from the exposed one surface of the metal layer to the inside of the opening portion of the support body;

removing the resist layer;

roughening the one surface of the support body, the one surface of the metal layer exposed from the one surface of the support body, one surface of the pad, and a side surface of the pad;

forming an insulating layer that covers the one surface of the support body, the roughened one surface of the metal layer, the roughened one surface of the pad, and the roughened side surface of the pad and that has a first recess portion in which the pad is embedded;

selectively removing the support body with respect to the metal layer to transfer the roughened one surface of the support body to a peripheral region, to the metal layer, on a first surface of the insulating layer;

selectively removing the metal layer with respect to the pad to transfer the roughened one surface of the metal layer to another surface of the pad and an adjacent portion, to the pad, of the first surface of the insulating layer;

removing a part of the pad exposed from the first surface of the insulating layer so as to expose an inner wall surface of the first recess portion of the insulating layer and to roughen said another surface of the pad;

forming, on the first surface of the insulating layer, a solder resist layer having an opening portion through which a part of said another surface of the pad is exposed, so that an adjacent portion of the solder resist layer to a peripheral portion of the opening portion of the solder resist layer extends to an inside of the first recess portion and covers the inner wall surface of the first recess portion and a peripheral portion of said another surface of the pad; and removing a part of the pad exposed to an inside of the opening portion of the solder resist layer to form a second recess portion having a smooth bottom surface, wherein the adjacent portion of the solder resist layer to the peripheral portion of the opening portion of the solder resist layer protrudes from the peripheral portion of said another surface of the pad toward a center portion of the pad and covers above the second recess portion, and an adjacent portion of the first surface of the insulating layer to the first recess portion is small in roughness than a region of the first surface of the insulating layer peripheral to the adjacent portion of the first surface of the insulating layer.

The exemplary embodiments have been described above in detail. However, the invention is not limited thereto. Various modifications and replacements can be made in the above exemplary embodiments without departing from the scope defined by the claims.

What is claimed is:

1. A wiring substrate, comprising:
an insulating layer having a first surface formed with a first recess portion;
a pad that is embedded in the first recess portion, the pad including
a second surface that is in contact with a bottom surface of the first recess portion, and
a third surface that is located at a lower position than the first surface of the insulating layer so as to expose an inner wall surface of the first recess portion, wherein the pad is formed with a second recess portion, having a smooth bottom surface, in a center portion of the third surface; and
a solder resist layer that is provided on the first surface of the insulating layer and that is formed with an opening portion through which the second recess portion is exposed, wherein
an adjacent portion of the solder resist layer to a peripheral portion of the opening portion extends to an inside of the first recess portion so as to cover the inner wall surface of the first recess portion and a peripheral portion of the third surface of the pad, and
protrudes from the peripheral portion of the third surface of the pad toward the center portion of the third surface of the pad so as to cover above the second recess portion,
(i) surfaces of the pad including the second surface of the pad and being in contact with the insulating layer and (ii) the peripheral portion of the third surface of the pad are roughened surfaces,
the first surface of the insulating layer is a roughened surface, and
an adjacent portion of the first surface to a peripheral portion of the first recess portion is smaller in roughness than a region of the first surface peripheral to the adjacent portion of the first surface.

2. The wiring substrate according to claim 1, wherein the adjacent portion of the solder resist layer protrudes from the peripheral portion of the third surface of the pad toward the center portion of the third surface of the pad so as to have an eaves shape that covers above the second recess portion.

3. The wiring substrate according to claim 1, wherein the roughened adjacent portion of the first surface surrounds the pad.

4. The wiring substrate according to claim 1, further comprising:
a surface-treated layer that covers the bottom surface of the second recess portion and an inner wall surface of the second recess portion and that does not fully fill the second recess portion.

5. The wiring substrate according to claim 4, wherein
the surface-treated layer includes
a bottom surface extending along the bottom surface of the second recess portion, and
an inner wall surface extending along the inner wall surface of the second recess portion.

6. The wiring substrate according to claim 1, wherein
the pad has a tapered shape in section, and
a width of the tapered shape in a vicinity of the bottom surface of the pad is narrower than that of the tapered shape in a vicinity of the first surface of the insulating layer.

7. The wiring substrate according to claim 1, wherein
the roughness of the adjacent portion of the first surface is in a range of 0.1 μm to 0.3 μm, and
the roughness of the region of the first surface peripheral to the adjacent portion of the first surface is in a range of 0.3 μm to 0.5 μm.

8. The wiring substrate according to claim 1, wherein a roughness of the bottom surface of the second recess portion is in a range of 0.1 μm to 0.2 μm.

9. The wiring substrate according to claim 1, wherein a roughness of the peripheral portion of the third surface of the pad is in a range of 0.5 μm to 0.8 μm.

10. The wiring substrate according to claim 1, wherein a step portion where the inner wall surface of the first recess portion is exposed is formed between the first surface of the insulating layer and the third surface of the pad.

* * * * *